(12) United States Patent
Lee et al.

(10) Patent No.: US 11,038,131 B2
(45) Date of Patent: Jun. 15, 2021

(54) ELECTROLUMINESCENT LIGHTING DEVICE HAVING HIGH APERTURE RATIO

(71) Applicant: LG Display Co., Ltd., Seoul (KR)

(72) Inventors: Kyu-Hwang Lee, Paju-si (KR); ChulHo Kim, Paju-si (KR); TaeJoon Song, Paju-si (KR); Kyungha Lee, Paju-si (KR); Taeok Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/729,145

(22) Filed: Dec. 27, 2019

(65) Prior Publication Data

US 2020/0212335 A1 Jul. 2, 2020

(30) Foreign Application Priority Data

Dec. 31, 2018 (KR) .................. 10-2018-0173306

(51) Int. Cl.
*H01L 51/10* (2006.01)
*H01L 51/50* (2006.01)
*H01L 51/52* (2006.01)

(52) U.S. Cl.
CPC ........ *H01L 51/107* (2013.01); *H01L 51/5044* (2013.01); *H01L 51/5064* (2013.01); *H01L 51/5068* (2013.01); *H01L 51/5246* (2013.01); *H01L 51/5262* (2013.01)

(58) Field of Classification Search
CPC ............ H01L 51/5044; H01L 51/107; H01L 51/5203; H01L 51/5262
See application file for complete search history.

(56) References Cited

U.S. PATENT DOCUMENTS

| 2015/0144906 A1* | 5/2015 | Ichikawa | ........... H01L 51/5228 257/40 |
| 2016/0013436 A1* | 1/2016 | Im | ...................... H01L 51/0017 257/40 |

\* cited by examiner

*Primary Examiner* — Feifei Yeung Lopez
(74) *Attorney, Agent, or Firm* — Seed IP Law Group LLP

(57) ABSTRACT

The present disclosure relates to an electroluminescent lighting device having high aperture ratio. The present disclosure provides an electroluminescent light device comprising: a substrate having an emission area and a non-emission area surrounding the emission area; a power line disposed in the emission area and defining an open area; a buffer layer covering the substrate having the power line; a power contact hole formed at the buffer layer for exposing some of the power line; an anode layer disposed on the buffer layer and contacting the power line through the power contact hole; a passivation layer covering the power contact hole on the anode layer; an emission layer on the anode layer; and a cathode layer on the emission layer.

11 Claims, 3 Drawing Sheets

ELECTROLUMINESCENT LIGHTING DEVICE HAVING HIGH APERTURE RATIO

CROSS-REFERENCE TO RELATED APPLICATIONS

This application claims the benefit of the Korean Patent Application No. 10-2018-0173306 filed on Dec. 31, 2018, which is hereby incorporated by reference as if fully set forth herein.

BACKGROUND

Technical Field

The present disclosure relates to an electroluminescent lighting device having a certain light emitting efficiency and aperture ratio.

Description of the Related Art

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is beneficial to have a robust structure against the foreign materials such as moisture and oxygen which can penetrate from the outside according to its applied environment. In addition, due to the loss of light amount occurred in the organic light emitting element itself, the luminescent efficiency may be degraded.

BRIEF SUMMARY

An electroluminescent lighting device according to the present disclosure protects the light emitting element from external environments (e.g., moisture, oxygen, or the like) and improves the luminescence efficiency/light emitting efficiency and achieves high aperture ratio. The present disclosure also provides a high aperture. electroluminescent lighting device having an enhanced stability and an elongated lifetime.

One embodiment of the present disclosure provides an electroluminescent light device including: a substrate having an emission area and a non-emission area surrounding the emission area; a power line disposed in the emission area and defining an open area; a buffer layer covering the substrate having the power line; a power contact hole formed at the buffer layer for exposing some of the power line; an anode layer disposed on the buffer layer and contacting the power line through the power contact hole; a passivation layer covering the power contact hole on the anode layer; an emission layer on the anode layer; and a cathode layer on the emission layer.

In one embodiment, the electroluminescent lighting device further includes: a light extracting layer disposed under the buffer layer for planarizing top surfaces of the substrate having the power line.

In one embodiment, the electroluminescent lighting device further includes: a capping layer disposed under the buffer layer and covering the power line.

In one embodiment, the anode layer contacts the capping layer covering the power line through the power contact hole.

In one embodiment, the passivation layer has an area larger than the power contact hole and smaller than a width of the power line.

In one embodiment, an emission element is configured by a stacked structure of the anode layer, the emission layer and the cathode layer over whole areas of the emission area excepting the passivation layer.

In one embodiment, the electroluminescent lighting device further includes: a routing line disposed in the non-emission area for connecting the power line and surrounding the emission area; a first pad disposed at one side of the non-emission area and connected to the routing line; and a second pad disposed at another side of the non-emission area, separated from the routing line, and connected to the cathode layer.

In one embodiment, the first pad includes: a first layer extended from the routing line; a second layer extended form the anode layer and covering the first layer; and a third layer separated from the cathode layer, having an island shape and covering the second layer.

In one embodiment, the second pad includes: a first layer separated from the routing line and having an island shape; a second layer separated from the anode layer and covering the first layer; and a third layer extended from the cathode layer and covering the second layer.

In one embodiment, the electroluminescent lighting device further includes: an encapsulation layer covering the emission area having an emission element; a cover film disposed on the encapsulation layer; and an adhesive attaching the encapsulation layer and the cover film.

The electroluminescent lighting device according to the present disclosure has a new structure in which the auxiliary power line is overlapped with the anode electrode not to be directly contacted but to be stacked with an insulation buffer layer there-between. In addition, having a point contact structure in which the anode electrode is connected to the auxiliary power line through a contact hole, the whole area of the anode electrode can be defined as the emission area so that the aperture ratio can be maximized. Further, the short circuit protection structure can be established by the point contact structure between the anode electrode and the auxiliary power line through the contact hole. The short circuit protection can be acquired without specific hardware element, so that the stability of the flexible lighting device could be enhanced.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
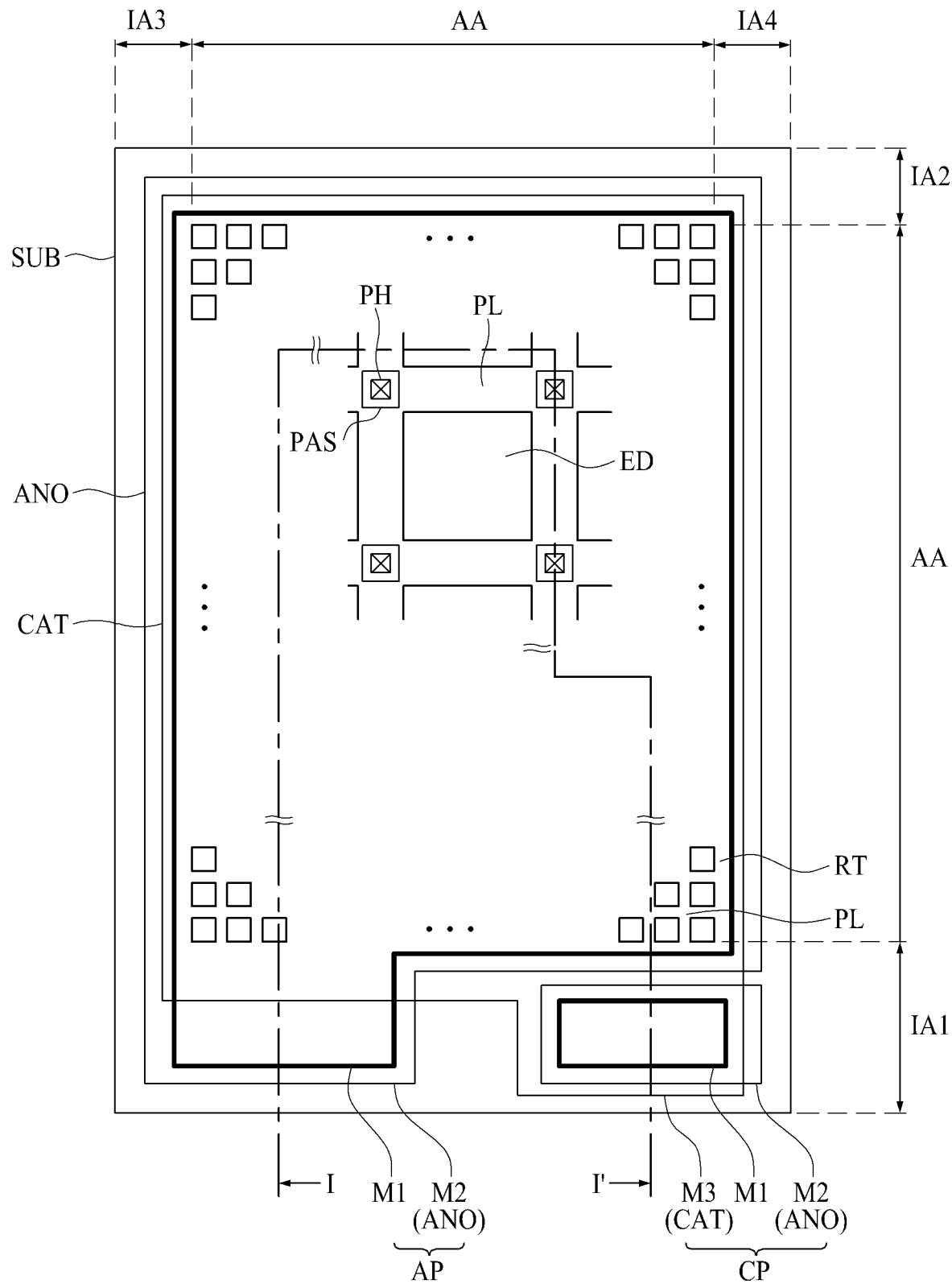
FIG. 1 is a plan view illustrating an electroluminescent lighting device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal (or X) axis direction," "second horizontal (or Y) axis direction," and "vertical (or Z) axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Figure 2:
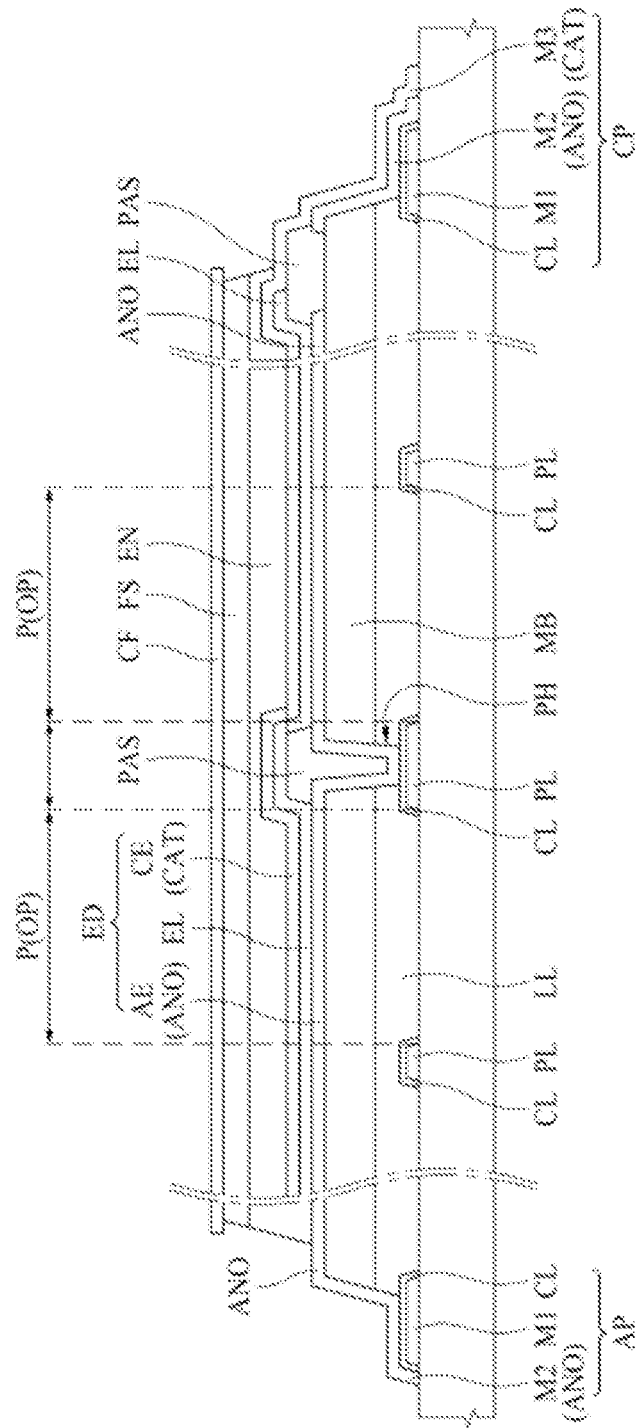
FIG. 2 is a cross-sectional view, taken along the cutting line I-I' of FIG. 1, illustrating a structure of the electroluminescent lighting device according to one embodiment of the present disclosure.

Hereinafter, referring to FIGS. 1 and 2, an electroluminescent lighting device according to the first embodiment of the present disclosure will be explained. FIG. 1 is a plan view illustrating an electroluminescent lighting device according to one embodiment of the present disclosure. FIG. 2 is a cross-sectional view, taken along the cutting line I-I' of FIG. 1, illustrating a structure of the electroluminescent lighting device according to one embodiment of the present disclosure. In this embodiment, the lighting device is an organic luminance lighting device, but it is not limited thereto.

Referring to FIGS. 1 and 2, the electroluminescent lighting device according to the present disclosure comprises a substrate SUB, a routing line RT, a power line PL, a light extracting layer LL, a buffer layer MB, an anode layer ANO, an emission layer EL, a cathode layer CAT, a first pad AP and a second pad CP.

The substrate SUB, as a based substrate (or a base layer), includes a plastic material or a glass material. The lighting device may have various shapes and the properties suitable for the functional purposes. Therefore, it is preferable that the substrate SUB has the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, for the case of the bottom emission type or bi-directional emission type, the substrate SUB is made of a transparent material. In another example, for the case of the top emission type, the substrate SUB may be made of an opaque material.

In one example, the substrate SUB, in a plan view, may have a rectangular shape, a rounded rectangular shape in which each corner is rounded with a certain radius of curvature, a non-square shape having at least five sides, a circular shape or an elliptical shape. However, other shapes and sizes can be used according to specific designs or needs and is not limited to the aforementioned shapes.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least five sides.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material. The flexible substrate SUB may be a thinned glass substrate having a thickness of about 100 micrometer or less, or may be etched glass substrate to have a thickness of about 100 micrometer or less.

On the upper surface of the substrate SUB, a first layer M1 of the first pad AP, the routing line RT, the power line PL and a first layer M1 of the second pad CP are formed of a metal material. The first layer M1 of the first pad AP, the routing line RT and the power line PL are made in one body connecting each other. For example, in one embodiment, the first layer M1 of the first pad AP, the routing line RT, and the power line PL is a single, continuous body. The first layer M1 of the second pad CP may be patterned so as to be separated from the first layer M1 of the first pad AP, the routing line RT and the power line PL. The first layer M1 of the first pad AP and the first layer M1 of the second pad CP may be disposed at one side and the other side of the first non-emission area IA1, respectively, being spaced apart at a predetermined distance. The predetermined distance may be selected based on the various applicable designs of the electroluminescent lighting device.

The routing line RT may be arranged as surrounding the edge/circumference of the substrate SUB. The routing line RT is disposed at the non-emission area IA and may have a closed curve shape surrounding the emission area AA, for example, a rectangular band shape. The routing line RT is an electric wiring line for supplying the electric power to the emission area AA. Therefore, the routing line RT may be formed as having one body with the first layer M1 of the first pad AP receiving the driving power voltage for the emission elements. For example, as shown in FIG. 1, the first layer M1 of the first pad AP may be formed in a protruded shape extending towards the first non-emission area IA1.

In addition, the first layer M1 of the second pad CP may be formed of the same material at the same layer as the routing line RT. The second pad CP may be an electric wiring line for supplying (−) voltage, ground voltage or base voltage. Therefore, the first layer M1 of the second pad CP is not physically or electrically connected to the first layer M1 of the first pad AP. For example, in the first non-emission area IA1, the first layer M1 of the second pad CP may be formed as an island shape spaced apart and separated from the routing line RT and the first layer M1 of the first pad AP at a predetermined distance.

The power line PL is disposed in the emission area AA as having a grid pattern or a strip pattern. The power line PL is connected to the routing line RT such that it may be formed as to have open areas OP of the grid shape or mesh shape, in the emission area AA. FIG. 1 shows the case in which the power line PL is formed as including a plurality of meshes having an open area, but it is not restricted thereto. The power lines PL are the branched lines from the routing line RT disposed in the non-emission area IA to the emission area AA and distributed uniformly over the whole surface of the substrate SUB. The aperture formed by the grid pattern of the power line PL may be defined as the open area OP.

The first layer M1 of the first pad AP and the first layer M1 of the power line PL and the second pad CP are covered by a capping layer CL. The capping layer CL may include a protective metal material for preventing the metal material of the first layer M1 of the first pad AP, the routing line RT, the power line PL and the first layer M1 of the second pad CP from being oxidized. For example, using a plating method or a solution coating method, a metal material such as nickel may be used for forming the capping layer CL covering the first layer M1 of the first pad AP, the routing line RT, the power line PL and the first layer M1 of the second pad CP.

The first layer M1 of the first pad AP, the routing line RT, the power line PL and the first layer M1 of the second pad CP may further include a low resistance material such as copper and aluminum. The copper may be oxidized in the post processing so it may result in extreme degradations of the conductive property or the adhesive property with respect to the substrate SUB. Formed as covering the upper surface and the etched side wall surfaces of the first layer M1 of the first pad AP, the routing line RT, the power line PL and the first layer M1 of the second pad CP, the capping layer CL can prevent the oxidization at post-processing.

On the surface of the substrate SUB having the first layer M1 of the first pad AP, the routing line RT, the power line PL and the first layer M1 of the second pad CP covered by the capping layer CL, a light extracting layer LL may be stacked. The light extracting layer LL may be formed by dispersing light scattering particles into an organic material having a high electric resistance. In addition, the light extracting layer LL may include a plurality of particles of which refraction index is very high in order to effectively radiate the lights generated from the emission layer EL out of the lighting device.

By stacking the light extracting layer LL on the surface of the substrate SUB having the power line PL, the upper surface of the substrate SUB may be planarized. When the emission element is formed on the planarized substrate SUB, the light efficiency can be enhanced. On the contrary, when the emission element is formed on the substrate of which top surface have severe a lot of level differences, the electric currents may be concentrated at the point where the level is changed which may result into the burning phenomena. In this case, the light emission may be concentrated where the electric currents are accumulated, so that the light efficiency may be degraded or the emission element may be defected by the burning phenomena. Covering the power line LL with the light extracting layer LL, the top surface of the substrate SUB can be planarized and then the emission element may be formed to ensure the superior quality of the lighting device.

On the light extracting layer LL, a buffer layer MB may be deposited. In one example, the buffer layer MB may include a plurality of inorganic layers which are alternatively stacked each other. For example, the buffer layer MB may be formed as a multi-layered structure in which at least one inorganic layer of silicon oxide (SiOx), silicon nitride (SiNx) or silicon oxynitride (SiON) are alternately stacked. In another example, the buffer layer MB may be formed as stacking at least two of an organic layer and an inorganic layer.

The buffer layer MB and the light extracting layer LL may have a power contact hole PH exposing some of the power line PL. The power contact hole PH may be formed on each crossing point of the mesh type power line PL. Under the condition before depositing the anode layer ANO, the power contact hole PH exposes the upper surface of the capping layer CL covering the power line PL. The capping layer CL may include a metal material having higher resistance than the power line PL and be connected with the anode layer ANO through the power contact hole PH. By selecting the material of the capping layer CL and the controlling the area of the power contact hole PH, the property of the contact resistance between the capping layer CL and the anode layer ANO can be optimized.

The light extracting layer LL and the buffer layer MB may cover the whole surface of the emission area AA. In addition, it may be extended to the non-emission area IA with a predetermined distance. However, some portions of the first pad AP and the second pad CP are not covered by but exposed to the light extracting layer LL and the buffer layer MB. The exposed portions of the first pad AP and the second pad CP are the pad portions for receiving the electrical signal or voltage from external devices.

By depositing a conductive material on the buffer layer MB, the anode layer ANO is formed. Here, the conductive material may include a transparent conductive material or a semi-transparent conductive material which can pass the lights. In one example, the transparent conductive material may include indium tin oxide or indium zinc oxide. In other example, the semi-transparent conductive material may further include magnesium (Mg), silver (Ag) or alloy of magnesium (Mg) and silver (Ag).

The anode layer ANO is deposited as covering the emission area AA. The whole areas of the anode layer ANO covering the emission area AA may be the first electrode AE of the emission element ED. One embodiment of the present disclosure is the surface emission lighting device in which a plurality of the emission elements ED are formed and arrayed over the whole surface of the emission area AA. To do so, in one example of the present disclosure, all of the plurality of first electrodes AE may be connected each other over the emission area AA so it forms a sheet electrode.

In the interim, the anode layer ANO may be extended from the emission area AA to the first non-emission area IA1 to form a second layer M2 covering the first layer M1 of the first pad AP. Furthermore, it may form the second layer M2 covering the first layer M1 of the second pad CP. Here, the second layer M2 of the first pad AP is connected to the anode layer ANO formed in the emission area AA, but the second layer M2 of the second pad CP should be separated from the other anode layers ANO.

The anode layer ANO is connected to the power line PL through the power contact hole PH in the emission area AA. Each power contact hole PH may be formed at each crossing point of the power line PL having the mesh structure. Therefore, the anode layer ANO having the sheet electrode structure may be connected to the power line PL through a plurality of power contact holes PH uniformly distributed over the whole surface of the emission area AA.

At upper portion of the power contact hole PH, a passivation layer PAS is deposited. In one embodiment, the passivation layer PAS, as an insulating material, is formed only over the power contact hole PH. In different embodiments, the passivation layer PAS, as an insulating material, is formed over the power contact hole PH and other elements/layers of the device. When the passivation layer PAS is so large then the area of the emission layer EL contacting to the first electrode AE will be reduced as the area of the passivation layer covering the anode layer ANO. As the result, the aperture ratio may be lowered.

When the area of the passivation layer PAS is too small so some of the power contact hole PH is exposed, the emission layer EL may be directly formed on the power contact hole PH. In this case, the power contact hole PH is the portion where the power line PL contact the anode layer ANO so that the driving current may be concentrate, so that the light emission may be concentrated at this point. As the results, the lights may not be uniformly radiated over the whole surface of the emission area AA, and the power contact hole PH may be overloaded and then damaged. Therefore, the passivation layer PAS is perfectly covering the power contact hole PH with minimum area.

The emission layer EL is deposited on the passivation layer PAS and the first electrode AE. In one embodiment, the emission layer EL is formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first light.

The cathode layer CAT is deposited on the emission layer EL. The cathode layer CAT may be deposited on the substrate SUB for covering the emission area AA. The cathode layer CAT may be deposited on some of the non-emission area IA as well as the emission area AA. The cathode layer CAT may have the same area as covering the emission area AA or the larger area of the emission area AA. For example, some of the cathode layer CAT may be extended to the second pad CP so it may cover the second pad CP which is not covered by the buffer layer MB and light extracting layer LL to connect with the second pad CP.

The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), and a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold (au), magnesium (Mg), calcium (Ca) or barium (Ba).

The portions of the cathode layer CAT contacting the emission layer EL in the emission area AA may be defined as the second electrode CE. The emission element ED may be formed by the stacked structure including the first electrode AE configured by the anode layer ANO, the emission layer EL and the second electrode CE configured by the cathode layer CAT. The electroluminescent lighting device according to the present disclosure, excepting the power contact hole PH within the whole areas of the emission area AA, the first electrode AE, the emission layer EL and the second electrode CE are stacked. That is, most of all portions of the emission area AA are formed into the emission element ED, so that it is configured to be a surface radiation structure.

The first pad AP may be disposed at a portion of the non-emission area IA. For example, the first pad AP may be disposed at one side of the first non-emission area IA1. In one example, the first pad AP may include a first layer M1 formed with the routing line RT as one body, and a second layer M2 formed with the anode layer ANO as one body. In this case, the second layer M2 of the first pad AP is not covered by the buffer layer MB and the light extracting layer LL but exposed, and has a structure in which the second layer M2 covers the capping layer CL covering the first layer M1. In another example, even though not shown in figure, a third layer made of the cathode layer CAT may be further included on the second layer M2. In that case, it is preferable that the third layer of the first pad AP has an island shape separated from the cathode layer CAT. The first pad AP may be an electric terminal pad for supplying the driving electric power to the routing line RT and the power line PL.

The second pad CP may be formed at other portion of the non-emission area IA. For example, the second pad CP may be disposed at the opposite side to the first non-emission area IA1 having the first pad AP. The second pad CP may include a first layer M1, a second layer M2 and a third layer M3, wherein the first layer M1 is formed as an island shape physically and electrically isolated from the routing line RT, wherein the second layer M2 is formed of the same material of the anode layer ANO but separated from other anode layer ANO, and wherein the third layer M3 is formed of the cathode layer CAT. The second pad CP, separated from the routing line RT, may be an electric pad terminal for supplying a common voltage to the cathode layer CAT.

An encapsulation layer EN may be deposited on the substrate SUB having the emission element ED. The encapsulation layer EN may include a single layered material, or a multiple layered material. In one example, the encapsulation layer EN may include a first inorganic layer, an organic layer on the first inorganic layer, and a second inorganic layer on the organic layer. The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method. The organic layer may prevent the elements from being damaged by covering or absorbing the particles which may be formed during the manufacturing processes. Therefore, the organic layer may be much thicker than the first and second inorganic layers.

The encapsulation layer EN may cover all emission area AA, and some of the non-emission area IA. However, in one embodiment, it is preferable that the encapsulation layer EN does not cover the first pad AP and the second pad CP to expose them.

On the encapsulation layer EN, a cover film CF may be disposed or attached. The cover film CF may be a thick film including metal material. In order to attach the cover film CF to the encapsulation layer EN, an adhesive FS may be used. In one embodiment, the cover film CF exposes the first pad AP and the second pad CP. However, other embodiments are not limited thereto.

In the examples of the electroluminescent lighting device according to the present disclosure, the lighting device has the bottom emission type in which the lights generated from the emission layer EL radiate to the anode layer ANO. For the bottom emission type, as the power line PL is disposed under the anode layer ANO, the portions where the power line PL is disposed may be non-emission area, because that even though these portions actually radiate the light, the lights do not radiated to the bottom direction. That is, the open area (or aperture area) OP is defined by the power line PL. On the contrary, for the top emission type, the lights generated from the emission layer EL radiate to the cathode layer CAT, so that the lights generated where the power line PL is disposed can be radiated to the upper direction. Therefore, the aperture ratio of the bottom emission type may be lower than that of the top emission type due to the power line PL.

Figure 3:
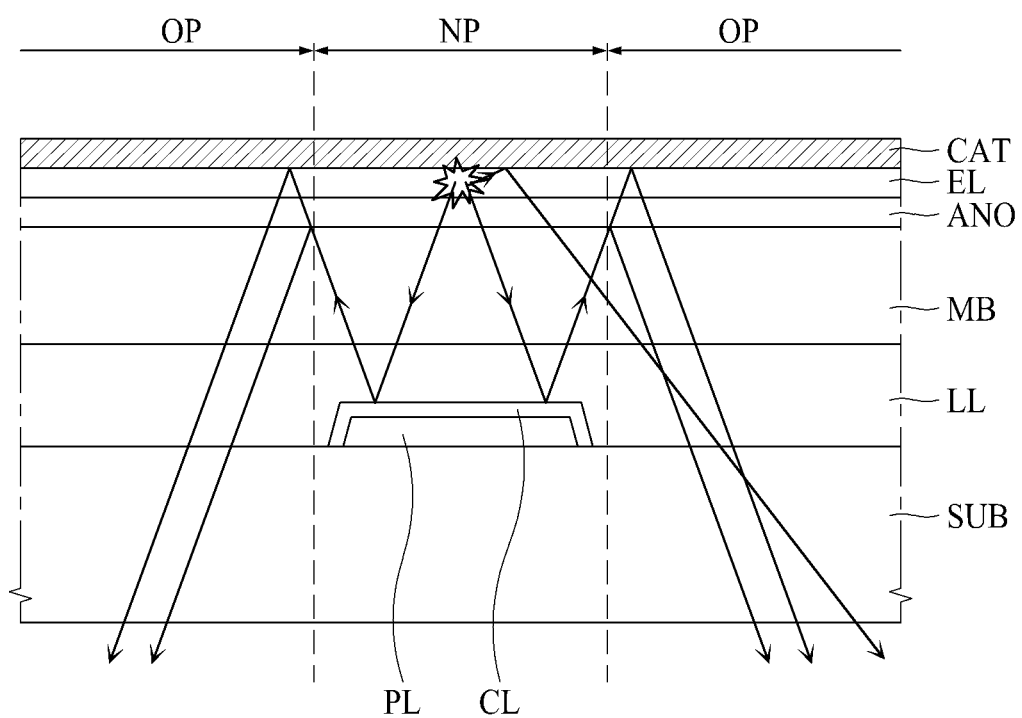
FIG. 3 is an enlarged cross-sectional view illustrating the structural characteristics for enhancing the light emitting efficiency of the electroluminescent lighting device according to the present disclosure.

Hereinafter, referring to FIG. 3, we will explain about the structure of the electroluminescent lighting device according one example of the present disclosure in which the light emission efficiency of the bottom emission type is enhanced. FIG. 3 is an enlarged cross-sectional view illustrating the structural characteristics for enhancing the light emitting efficiency of the electroluminescent lighting device according to the present disclosure.

The power line PL may include a metal material having relatively low electrical resistance property such as copper (Cu). In addition, in order to prevent from being oxidized, a capping layer CL made of anti-corrosive metal material such as nickel (Ni) may cover the upper surface and the etched side wall surface of the power line PL. The poser line PL may have a mesh structure, and the area surrounded by the power line PL may be defined as the open area OP. The area where the power line PL is disposed may be defined as the non-open area NP.

Under this condition, the aperture ration, which is a ratio of open area OP to the emission area AA, of the bottom emission type may be slightly lower than that of the top emission type. However, the light efficiency of the bottom emission type may not be different so much from that of the top emission type.

Referring to FIG. 3, the emission element ED is formed at the area over the power line PL. That is, the anode layer ANO, the emission layer EL and the cathode layer CAT are stacked over the power line PL. As the result, the lights are generated from the non-open area NP over the power line PL. These lights cannot be directly radiated to the bottom direction of the power line PL. These lights are reflected by the power line PL and go to the upper side and then the reflected lights are reflected by the cathode layer CAT again. Then, these re-reflected lights may be reached to the open area OP and then radiated to the bottom direction.

In detail, the lights generated at the upper area of the power line PL may be radiated to all direction. These lights radiated to the upper area of the non-open area NP are reflected by the cathode layer CAT. Some of the reflected lights may be reached to the open area OP so that these portions of the light can be radiated to the bottom direction. Other lights may be re-reflected by the power line PL. These re-reflected lights may be reflected by the cathode layer CAT again. By these reflecting and re-reflecting processes, the lights can be gotten off the non-open area NP and reached to the open area OP. As the result, most of all lights generated at the upper area of the power line PL may be radiated to the bottom direction.

The lights generated at the non-open area NP and radiated to the bottom direction may be directly reflected by the capping layer and the power line PL. Here, by the difference of the refraction index between the capping layer CL and the power line PL, the lights may be reflected in a diffused condition. That is, the diffused-reflected lights by the power line PL may be reflected by the cathode layer CAT again. By these reflecting and re-reflecting processes, the lights can be gotten off the non-open area NP and reached to the open area OP. As the result, most of all lights generated at the upper area of the power line PL may be radiated to the bottom direction. Consequently, even though the aperture ratio of the bottom emission type is lower than the top emission type, the light emission efficiency of the bottom emission type may have the similar grade with that of the top emission type.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. Further, these and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent lighting device, comprising:
a substrate having an emission area and a non-emission area adjacent to the emission area;
a plurality of power lines disposed in the emission area and forming a plurality of open areas between the power lines;
a buffer layer on the power lines;
a power contact hole formed at the buffer layer and partially exposing at least one power line of the plurality of power lines;
an anode layer disposed on the buffer layer and contacting the at least one power line through the power contact hole;
a passivation layer covering the power contact hole on the anode layer;
an emission layer on the anode layer; and
a cathode layer on the emission layer,
wherein the passivation layer has an area larger than the power contact hole and a width smaller than a width of the at least one power line.

2. An electroluminescent lighting device, comprising:
a substrate having an emission area and a non-emission area adjacent to the emission area;
a plurality of power lines disposed in the emission area and forming a plurality of open areas between the power lines;
a buffer layer on the power lines;
a power contact hole formed in the buffer layer and partially exposing at least one power line of the plurality of power lines;
a light extracting layer disposed between the buffer layer and the at least one power line, the light extracting layer planarizing top surfaces of the substrate and the power line;
an anode layer disposed on the buffer layer and contacting the at least one power line through the power contact hole;
a passivation layer covering the power contact hole on the anode layer;
an emission layer on the anode layer; and
a cathode layer on the emission layer.

3. The device according to claim 1, further comprising:
a capping layer covering the power line, wherein the buffer layer is on the capping layer.

4. The device according to claim 3, wherein the anode layer contacts the capping layer covering the at least one power line through the power contact hole.

5. The device according to claim 1, wherein the anode layer, the emission layer and the cathode layer forms an emission element by forming a stacked structure over the entire emission area excepting the passivation layer.

6. An electroluminescent lighting device, comprising:
a substrate having an emission area and a non-emission area adjacent to the emission area;
a plurality of power lines disposed in the emission area and forming a plurality of open areas between the power lines;
a buffer layer on the power lines;
a power contact hole formed in the buffer layer and partially exposing at least one power line of the plurality of power lines;
an anode layer disposed on the buffer layer and contacting the at least one power line through the power contact hole;
a passivation layer covering the power contact hole on the anode layer;
an emission layer on the anode layer;
a cathode layer on the emission layer;

a routing line disposed in the non-emission area for connecting the at least one power line and surrounding the emission area;

a first pad disposed at one side of the non-emission area and connected to the routing line; and a second pad disposed at another side of the non-emission area, separated from the routing line, and connected to the cathode layer.

7. The device according to claim 6, wherein the first pad includes:

a first layer extended from the routing line; and a second layer extended form the anode layer and covering the first layer.

8. The device according to claim 6, wherein the second pad includes:

a first layer separated from the routing line and having an island shape;

a second layer separated from the anode layer and covering the first layer; and a third layer extended from the cathode layer and covering the second layer.

9. The device according to claim 1, further comprising:

an encapsulation layer covering the emission area having an emission element;

a cover film disposed on the encapsulation layer; and an adhesive attaching the encapsulation layer and the cover film.

10. The device according to claim 2, wherein the light extracting layer includes light scattering particles and organic material having high electric resistance.

11. The device according to claim 2, wherein the light extracting layer includes particles having high refraction index capable of effectively radiating light generated from the emission layer out of the device.

* * * * *